(12) United States Patent
Chuang et al.

(10) Patent No.: US 11,410,957 B2
(45) Date of Patent: Aug. 9, 2022

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventors: Shao Hsuan Chuang, Kaohsiung (TW); Huang-Hsien Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/937,497

(22) Filed: Jul. 23, 2020

(65) Prior Publication Data
US 2022/0028817 A1 Jan. 27, 2022

(51) Int. Cl.
*H01L 23/00* (2006.01)

(52) U.S. Cl.
CPC .............. *H01L 24/20* (2013.01); *H01L 24/19* (2013.01); *H01L 2224/2101* (2013.01)

(58) Field of Classification Search
CPC .. H01L 24/20; H01L 24/19; H01L 2224/2101
See application file for complete search history.

(56) References Cited

U.S. PATENT DOCUMENTS

| 2019/0096842 A1 | 3/2019 | Fountain et al. |
| 2021/0202382 A1* | 7/2021 | Oki ................... H01L 27/11556 |

* cited by examiner

*Primary Examiner* — Timor Karimy
(74) *Attorney, Agent, or Firm* — Foley & Lardner LLP

(57) ABSTRACT

At least some embodiments of the present disclosure relate to a method for manufacturing a bonding structure. The method includes: providing a substrate with a seed layer; forming a conductive pattern on the seed layer; forming a dielectric layer on the substrate and the conductive pattern; and removing a portion of the dielectric layer to expose an upper surface of the conductive pattern without consuming the seed layer.

17 Claims, 10 Drawing Sheets

SEMICONDUCTOR PACKAGE STRUCTURE AND METHOD OF MANUFACTURING THE SAME

BACKGROUND

1. Technical Field

The present disclosure relates to a bonding structure. In particular, a bonding structure has different dielectrics.

2. Description of the Related Art

Generally, a seed layer is used for increasing adhesion between a metal layer and a dielectric layer. Regarding hybrid bonding technique for semiconductor packages, current art adopts chemical mechanical polishing (CMP) operations to remove a portion of a conductive pad (including a metal layer and a seed layer lining the metal layer) and a portion of a dielectric layer surrounding the conductive pad.

Since etching selectivity of the seed layer is different from that of the metal layer, a periphery of the metal layer may be excessively removed, generating a corrosion defect with a recess of from about 5 nm to 10 nm at the periphery of the metal layer. Alternatively stated, after CMP operations, the metal portion of the conductive pad would have a convex upper surface from a cross sectional perspective. Accordingly, when one planarized conductive pad bonds against a corresponding one, such convex upper surface reduces the effective bonding area therebetween. Such phenomenon is adversary to the electrical connection, for example, the bonding strength may be compromised, and the resistance is increased.

SUMMARY

In some embodiments, according to one aspect of the present disclosure, a method is disclosed for manufacturing a bonding structure. The method includes: providing a substrate with a seed layer; forming a conductive pattern on the seed layer; forming a dielectric layer on the substrate and the conductive pattern; and removing a portion of the dielectric layer to expose an upper surface of the conductive pattern without consuming the seed layer.

In some embodiments, according to one aspect of the present disclosure, a bonding structure comprises a substrate, a seed layer disposed on the substrate, a first conductive pattern disposed on the seed layer, and a dielectric layer surrounding the first conductive pattern. The dielectric layer is in contact with a lateral surface of the seed layer and a lateral surface of the first conductive pattern.

In some embodiments, according to another aspect of the present disclosure, a semiconductor device package comprises a first bonding structure, a second bonding structure bonding to the first bonding structure, and a spin-coating dielectric between the first bonding structure and the second bonding structure. The first bonding structure comprises a first substrate, a first seed layer disposed on the first substrate, a first conductive pattern disposed on the first seed layer, and a first dielectric layer surrounding the first conductive pattern. The first dielectric layer includes a first recess. The second bonding structure comprises a second substrate, a second seed layer disposed on the second substrate, a second conductive pattern disposed on the second seed layer, and a second dielectric layer surrounding the second conductive pattern. The second dielectric layer includes a second recess. The spin-coating dielectric fills a space defined by the first recess and the second recess.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
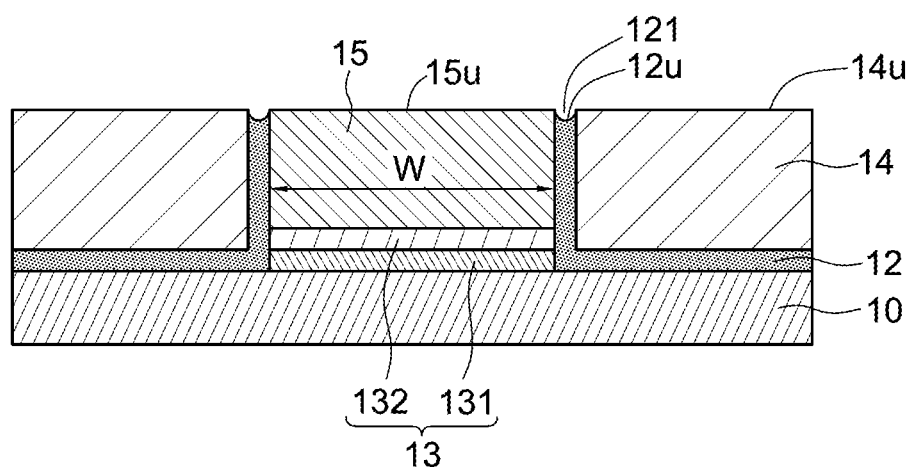
FIG. 1 illustrates a cross-sectional view of a bonding structure according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a bonding structure 1 in accordance with some embodiments of the present disclosure. The bonding structure 1 includes a substrate 10, a dielectric layer 12, a seed layer 13, a dielectric layer 14, and a conductive pattern 15. The substrate 10 may include silicon or other suitable materials.

The seed layer 13 is disposed on the substrate 10. The seed layer 13 may include multiple layers. The seed layer 13 includes a conductive layer 131 and conductive layer 132. The conductive layer 131 may include Ti or other suitable materials. The conductive layer 132 may include Au, Ag, Cu, or other suitable materials. In some embodiments, the seed layer 13 has a thickness in a range from approximately 0.5 µm to approximately 2.5 µm.

The conductive pattern 15 is disposed on the seed layer 13. The conductive pattern 15 may include Cu or other suitable materials. The seed layer 13 and the conductive pattern 15 may form a bonding pad. A width (W) of the conductive pattern 15 is substantially identical to a width (W) of the seed layer 13. A lateral surface of the conductive pattern 15 is substantially coplanar with a lateral surface of the seed layer 13. An upper surface 15u of the conductive pattern 15 is exposed from the dielectric layer 12. The upper surface of the conductive pattern 15 is exposed from the dielectric layer 14.

The dielectric layer 12 is disposed on the substrate 10. The dielectric layer 12 is in contact with an upper surface of the substrate 10. The dielectric layer 12 surrounds the seed layer 13 and the conductive pattern 15. The dielectric layer 12 laterally surrounds the seed layer 13 and the conductive pattern 15 from a top view perspective. A lateral surface of the dielectric layer 12 is in contact with the lateral surface of the seed layer 13. The lateral surface of the dielectric layer 12 is in contact with the lateral surface of the conductive pattern 15. The dielectric layer 12 includes a recess 121. The dielectric layer 12 has an upper surface 12u. The upper surface 12u is a curved surface. The upper surface 12u is a concave surface. The recess 121 surrounds the conductive pattern 15. The recess 121 laterally surrounds the conductive pattern 15 from a top view perspective.

The dielectric layer 12 is formed by a CVD-deposition operation. The dielectric layer 12 includes silicon oxide. In some embodiments, the dielectric layer 12 has a thickness in a range from approximately 0.5 µm to approximately 4.5 µm.

The dielectric layer 14 is disposed on the substrate 10. The dielectric layer 14 is disposed on the dielectric layer 12. An interface is between the dielectric layer 12 and the dielectric layer 14. The dielectric layer 14 is in contact with the dielectric layer 12. The dielectric layer 14 surrounds the dielectric layer 12. The dielectric layer 14 surrounds the seed layer 13 and the conductive pattern 15. The dielectric layer 12 is sandwiched by the dielectric layer 14 and the bonding pad composed of the seed layer 13 and the conductive pattern 15.

In some embodiments, an upper surface 14u of the dielectric layer 14 may be substantially coplanar with the upper surface 15u of the conductive pattern 15. In some embodiments, the upper surface 14u of the dielectric layer 14 may be higher than the upper surface 12u of the dielectric layer 12 or the upper surface 15u of the conductive pattern 15.

The dielectric layer 14 includes spin-coating dielectric. The dielectric layer 14 includes a porous material. The dielectric layer 14 includes silicon oxide. The dielectric layer 14 includes a plurality of silicon oxide particles and polymeric materials. The material of the dielectric layer 12, which is deposited by CVD operations, is denser than that of the dielectric layer 14, which is spin-coated and cured.

Under such arrangement and as previously described, the upper surface 15u of the conductive pattern 15 is free of corrosion defects, for example, the upper surface 15u at the periphery of the conductive pattern 15 is substantially coplanar with the upper surface 14u of the dielectric layer 14 and elevated from the upper surface 12u of the dielectric layer 12. The upper surface 15u of the conductive pattern 15, including a center and a periphery, would be substantially planar. Accordingly, an electrical connection of the bonding pad of the bonding structure 1 could be well maintained without compromising bonding strength and without increasing resistance. In some embodiments, depending on the hybrid bonding conditions, a periphery of the upper surface 15u of the conductive pattern 15 may be higher than a center of the upper surface 15u so as to reserve a room for conductive material expansion during the hybrid bonding operation.

Figure 2:
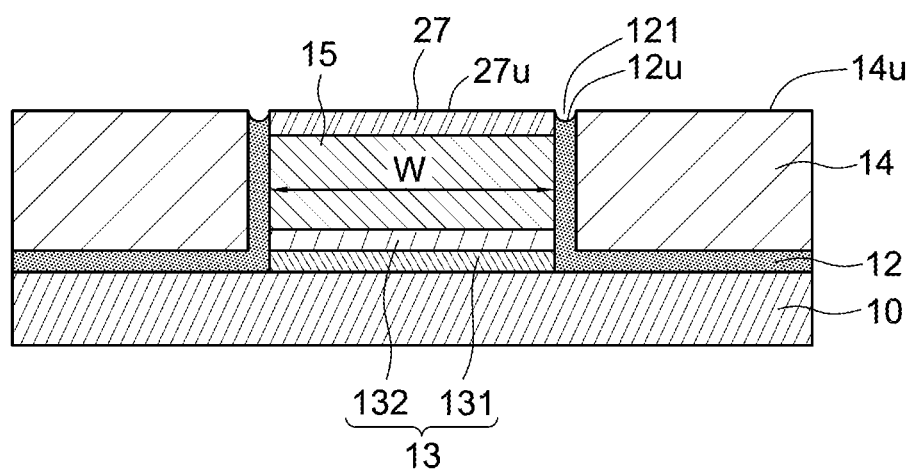
FIG. 2 illustrates a cross-sectional view of a bonding structure according to some embodiments of the present disclosure.

FIG. 2 is a cross-sectional view of a bonding structure 2 in accordance with some embodiments of the present disclosure. The bonding structure 2 is similar to the bonding structure 1 in FIG. 1 except that the bonding structure 2 further includes a conductive pattern 27 disposed on the conductive pattern 15. A material of the conductive pattern 27 is different from the material of the conductive pattern 15. The conductive pattern 27 may include Au, Ag, Ni/Au, or other suitable materials. The conductive pattern 27 may be selected from conductive materials with a lower bonding temperature than copper.

An upper surface 27u of the conductive pattern 27 is exposed from the dielectric layer 12 or 14. An upper surface 14u of the dielectric layer 14 may be substantially coplanar with the upper surface 27u of the conductive pattern 27. A lateral surface of the conductive pattern 27 is in contact with the dielectric layer 12. The upper surface 27u of the conductive pattern 27 would not be mechanically polished or damaged. The upper surface 27u of the conductive pattern 27 would be substantially planar.

Figure 3:
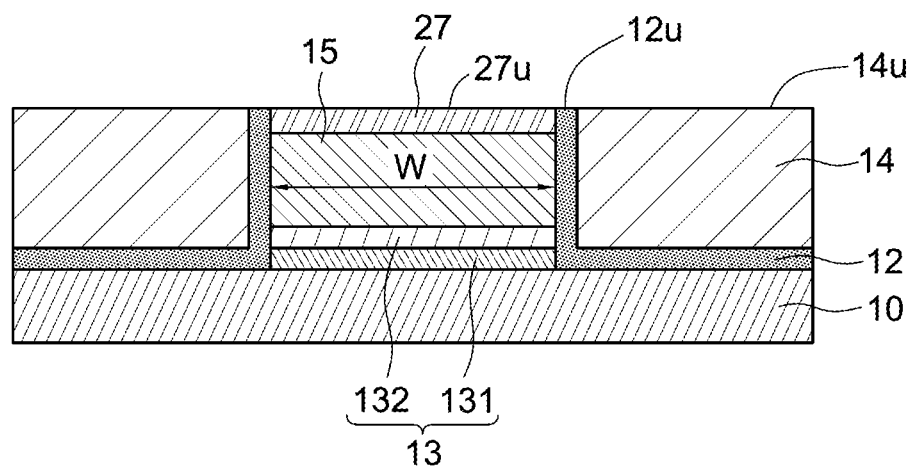
FIG. 3 illustrates a cross-sectional view of a bonding structure according to some embodiments of the present disclosure.

FIG. 3 is a cross-sectional view of a bonding structure 3 in accordance with some embodiments of the present disclosure. The bonding structure 3 is similar to the bonding structure 2 in FIG. 2 except that the dielectric layer 12 of the bonding structure 3 has no recess. An upper surface 27u of the conductive pattern 27, the upper surface 12u of the dielectric layer 12, and the upper surface 14u of the dielectric layer 14 are substantially coplanar with one another.

Figure 4:
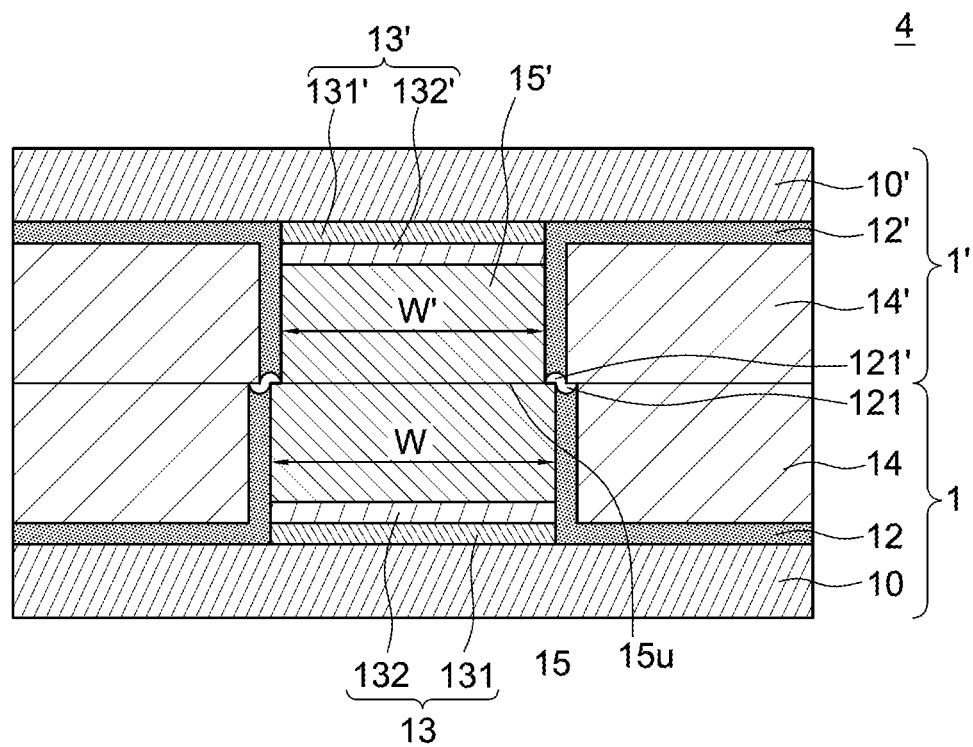
FIG. 4 illustrates a cross-sectional view of a semiconductor device package according to some embodiments of the present disclosure.

FIG. 4 is a cross-sectional view of a semiconductor device package 4 in accordance with some embodiments of the present disclosure. The semiconductor device package 4 includes a bonding structure 1 and a bonding structure 1'. The bonding structure 1' is similar to the bonding structure 1 in FIG. 1 except that a width (W') of a conductive pattern 15' and a width (W') of a seed layer 13' are smaller than the width (W) of the conductive pattern 15 and the width (W) of the seed layer 13. In some embodiments, for the purpose of achieving better alignment, a footprint of the conductive pattern 15' at the upper bonding structure 1' is smaller than a footprint of the conductive pattern 15 at the lower bonding structure 1.

The bonding structure 1 is bonded to the bonding structure 1'. The bonding structure 1 is electrically connected to the bonding structure 1'. Since the upper bonding surfaces are substantially flat, the upper surface 15u of the conductive pattern 15 is in contact with an entire upper surface 15'u of the conductive pattern 15'.

A recess 121' of the bonding structure 1' and the recess 121 of the bonding structure 1 may be partially overlapped. In some embodiments, the recess 121' partially overlaps the conductive pattern 15. As illustrated in FIG. 4, the dielectric layer 14' and the dielectric layer 14 are filled into the space defined by the recess 121 and the recess 121' so that the lateral surfaces of the seed layer 13', 13, and the conductive pattern 15', 15, are surrounded by either the dielectric layer 12', 12 or the dielectric layer 14', 14.

The dielectric layer 14 and a dielectric layer 14' is disposed between the dielectric layer 12 and a dielectric layer 12'. The dielectric layer 14 and a dielectric layer 14' fill a space defined by the recess 121 and a space defined by a recess 121'. In some embodiments, the dielectric layer 14 and the dielectric layer 14' may be formed as a continuous dielectric material. The continuous dielectric material is in contact with the conductive pattern 15. In some embodiments, monolithic dielectric may be in contact with the conductive pattern 15'.

Figure 5:
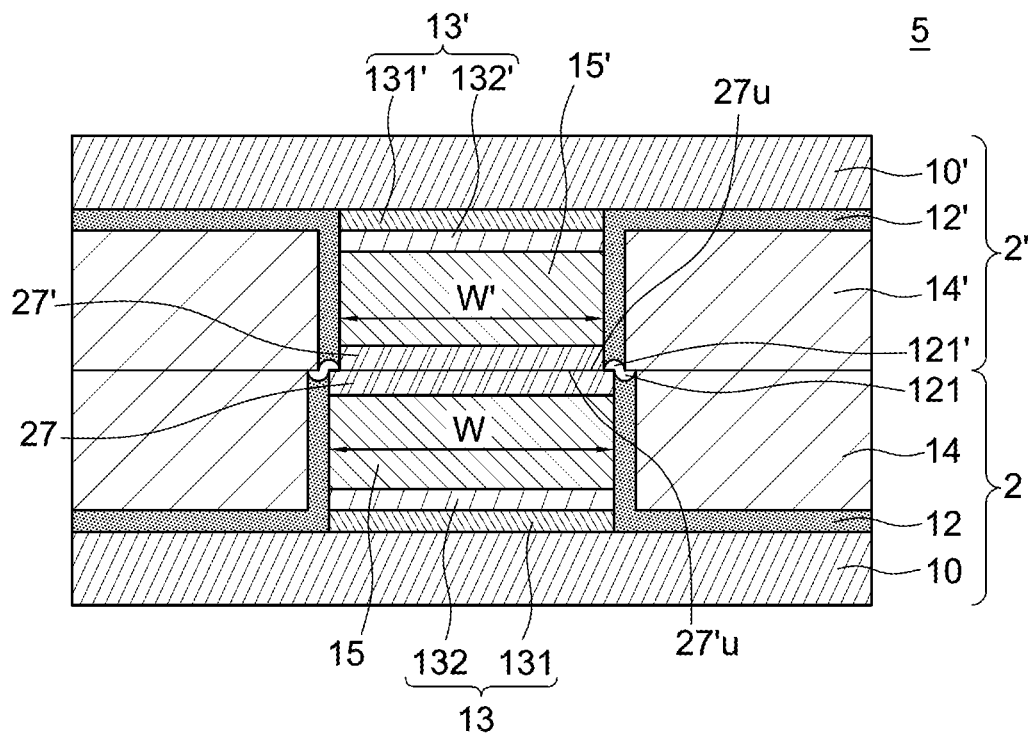
FIG. 5 illustrates a cross-sectional view of a semiconductor device package according to some embodiments of the present disclosure.

FIG. 5 is a cross-sectional view of a semiconductor device package 5 in accordance with some embodiments of the present disclosure. The semiconductor device package 5 includes a bonding structure 2 and a bonding structure 2'. The bonding structure 2' is similar to the bonding structure 2 in FIG. 2 except that a width (W') of a conductive pattern 15' and a width (W') of a seed layer 13' are smaller than the width (W) of the conductive pattern 15 and the width (W) of the seed layer 13. In some embodiments, for the purpose of achieving better alignment, a footprint of the conductive pattern 15' at the upper bonding structure 2' is smaller than a footprint of the conductive pattern 15 at the lower bonding structure 2.

The bonding structure 2 is bonded to the bonding structure 2'. The bonding structure 2 is electrically connected to the bonding structure 2'. Since the upper bonding surfaces are substantially flat, the upper surface 27u of the conductive pattern 27 is in contact with an entire upper surface 27'u of the conductive pattern 27'.

A recess 121' of the bonding structure 2' and the recess 121 of the bonding structure 2 may be partially overlapped. In some embodiments, the recess 121' partially overlaps the conductive pattern 15. As illustrated in FIG. 5, the dielectric layer 14' and the dielectric layer 14 are filled into the space defined by the recess 121 and the recess 121' so that the lateral surfaces of the seed layer 13', 13, and the conductive pattern 15', 15, are surrounded by either the dielectric layer 12', 12 or the dielectric layer 14', 14.

The dielectric layer 14 and a dielectric layer 14' is disposed between the dielectric layer 12 and a dielectric layer 12'. The dielectric layer 14 and a dielectric layer 14' fill a space defined by the recess 121 and a space defined by a recess 121'. In some embodiments, the dielectric layer 14 and the dielectric layer 14' may be formed as a continuous dielectric material. The continuous dielectric material is in contact with the conductive pattern 27. In some embodiments, monolithic dielectric may be in contact with the conductive pattern 27'.

FIG. 6A through FIG. 6H illustrate some embodiments of a method of manufacturing a semiconductor device package 4 according to some embodiments of the present disclosure. Various figures have been simplified to more clearly present aspects of the present disclosure.

Figure 6A:
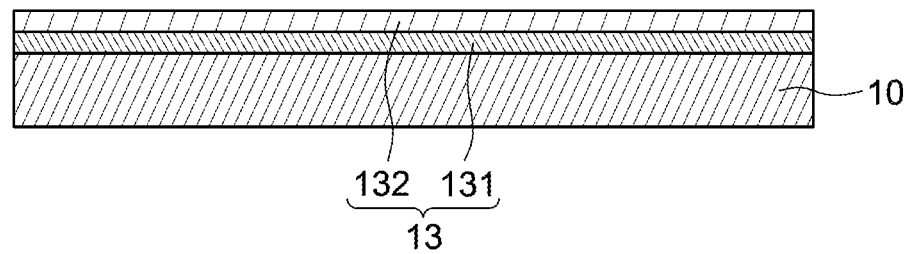
FIG. 6A to FIG. 6H illustrate intermediate operations of a method for manufacturing a semiconductor device package according to some embodiments of the present disclosure.

Referring to FIG. 6A, the method for manufacturing the semiconductor device package 4 (shown in FIG. 4 and FIG. 6H) includes providing a substrate 10. The substrate 10 may be a silicon substrate or other suitable materials. A seed layer 13 is formed on the substrate 10. The seed layer 13 may include a multi-layer structure, for example, including a conductive layer 131 and a conductive layer 132. The conductive layer 131 and the conductive layer 132 are formed on the substrate 10 by physical vapor deposition operations, including, but not limited to, sputtering operations. The conductive layer 131 may include adhesion-enhancing materials such as Ti. The conductive layer 132 may include Cu.

Figure 6B:
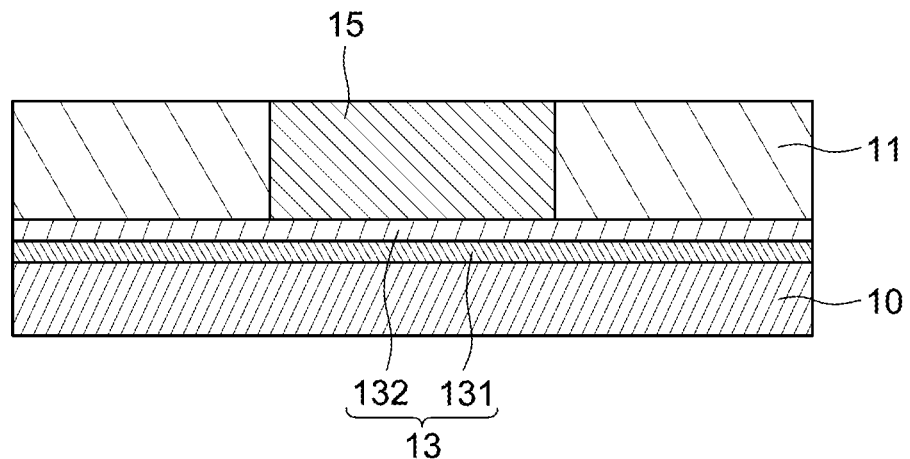

Referring to FIG. 6B, a photoresist 11 is applied on the seed layer 13. The photoresist 11 is used as a masking layer. Subsequently, the photoresist 11 is patterned to form an opening by a photolithographic operation. A conductive material is filled in the opening by an electroplating operation to form a conductive pattern 15. For example, the conductive material includes electroplated copper. During the electroplating of the conductive material, the sidewall of the opening defined by the photoresist 11 is free of any seed layer 13, and the electroplated copper is directly in contact with the photoresist 11.

Figure 6C:
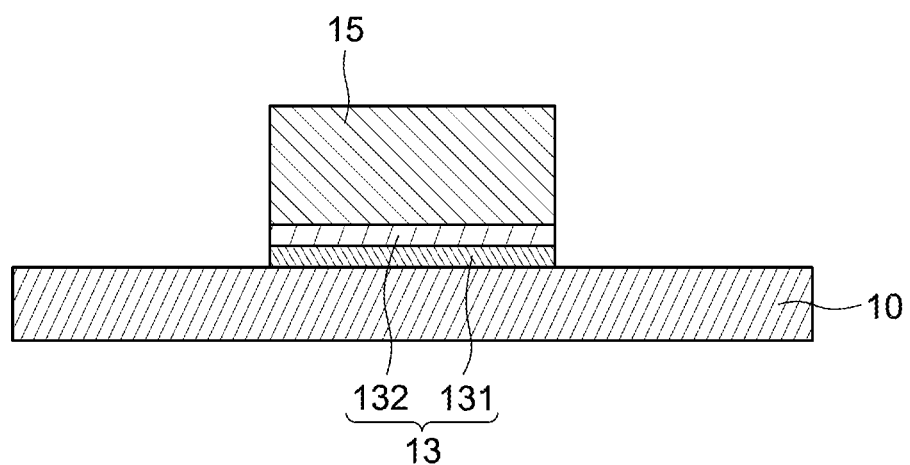

Referring to FIG. 6C, the photoresist 11 is removed. The seed layer 13 underneath the photoresist 11 is removed during the photoresist stripping operation or another etching operation. A remain portion of the seed layer 13 and the conductive pattern 15 may be further processed for a bonding pad used in a hybrid bonding scenario.

Figure 6D:
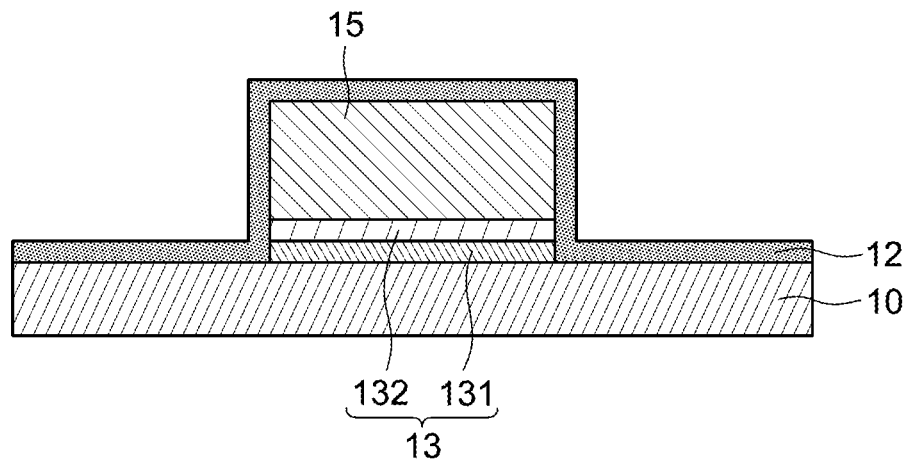

Referring to FIG. 6D, a dielectric layer 12 is conformably formed on the substrate 10 and the bonding pad by a CVD operation. The dielectric layer 12 includes silicon oxide and is conformably covering the lateral surfaces of the seed layer 13 and the conductive pattern 15, as well as a top surface of the conductive pattern 15. In some embodiments, the dielectric layer 12 has a thickness in a range from approximately 0.5 μm to approximately 4.5 μm. The dielectric layer 12 may be used as an etch stop in the subsequent operations.

Figure 6E:
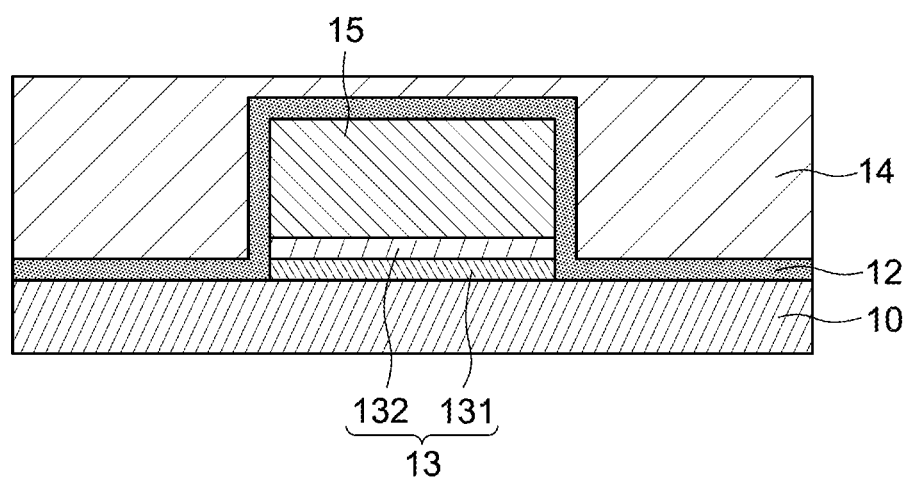

Referring to FIG. 6E, a dielectric layer 14 is formed over the dielectric layer 12 and the bonding pad by a spin coating operation. The dielectric layer 14 entirely covers the dielectric layer 12. After the spin coating operation, the dielectric layer 14 is cured to volatilize solvent therein. The curing temperature is lower than a glass transition temperature (Tg) of the dielectric layer 14, for example, a glass transition temperature (Tg) is from about 180 degrees Celsius to about 220 degrees Celsius. An interface can be observed between the dielectric layer 12 and the dielectric layer 14. The dielectric layer 12 is having a greater density than the dielectric layer 14.

Figure 6F:
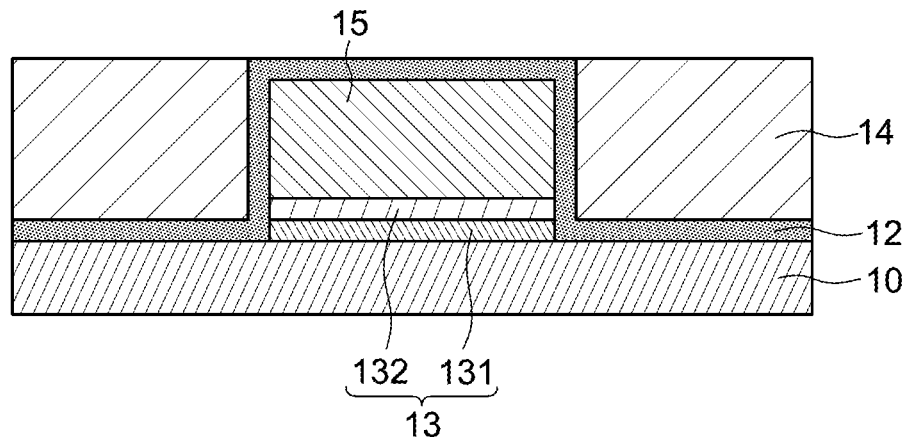

Referring to FIG. 6F, a surface treatment is performed to remove a portion of the dielectric layer 14 until the exposure of the dielectric layer 12 by a dry etching operation. The surface treatment, or the thinning operation, stops when the dielectric layer 12 is exposed from the dielectric layer 14. The etching chemistry and conditions are designed to have greater selectivity to the dielectric layer 14 (i.e., etching the dielectric layer 14 at a greater rate than that to the dielectric layer 12). As exemplified in FIG. 6F, the dielectric layer 12 serves as an etch stop for the dry etching operation.

Figure 6G:
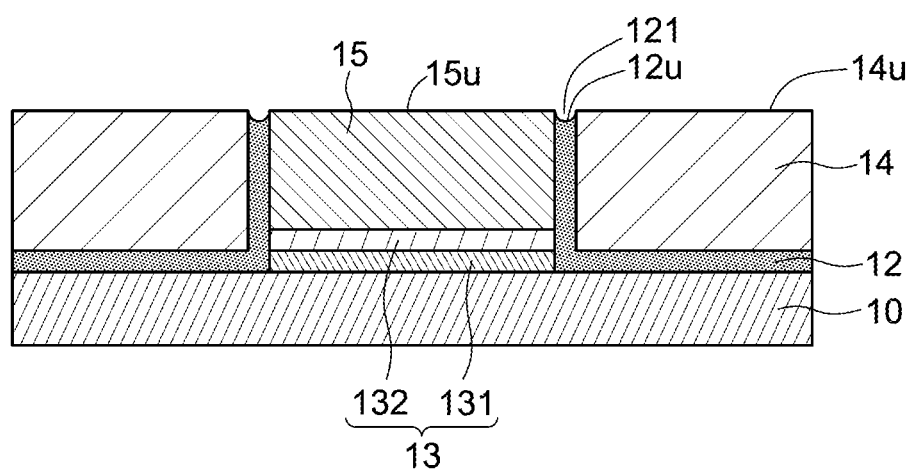

Referring to FIG. 6G, an additional surface treatment is performed to remove a portion of the dielectric layer 12 and a portion of the dielectric layer 14 by a dry etching operation. The etching chemistry and conditions are designed to have greater selectivity to the dielectric layer 12 (i.e., etching the dielectric layer 12 at a greater rate than that to the dielectric layer 14). The dry etching operation performed in FIG. 6G mildly removes the portion of the dielectric layer 12 covering the top surface 15u of the conductive pattern 15 while remove the dielectric layer 14 at a significant slower rate.

After the additional surface treatment as illustrated in FIG. 6G, a recess 121 is formed in the dielectric layer 12. The dielectric layer 12 includes an upper surface 12u. The upper surface 12u is a curved surface. The dielectric layer 14 includes an upper surface 14u. An upper surface 15u of the conductive pattern 15 is exposed from the dielectric layer 12 and the dielectric layer 14. The upper surface 15u of the conductive pattern 15 is coplanar with an upper surface 14u of the dielectric layer 14. The conductive pattern 15 would not be damaged during the additional surface treatment. A bonding structure 1 as previously described in FIG. 1 is formed accordingly.

Figure 6H:
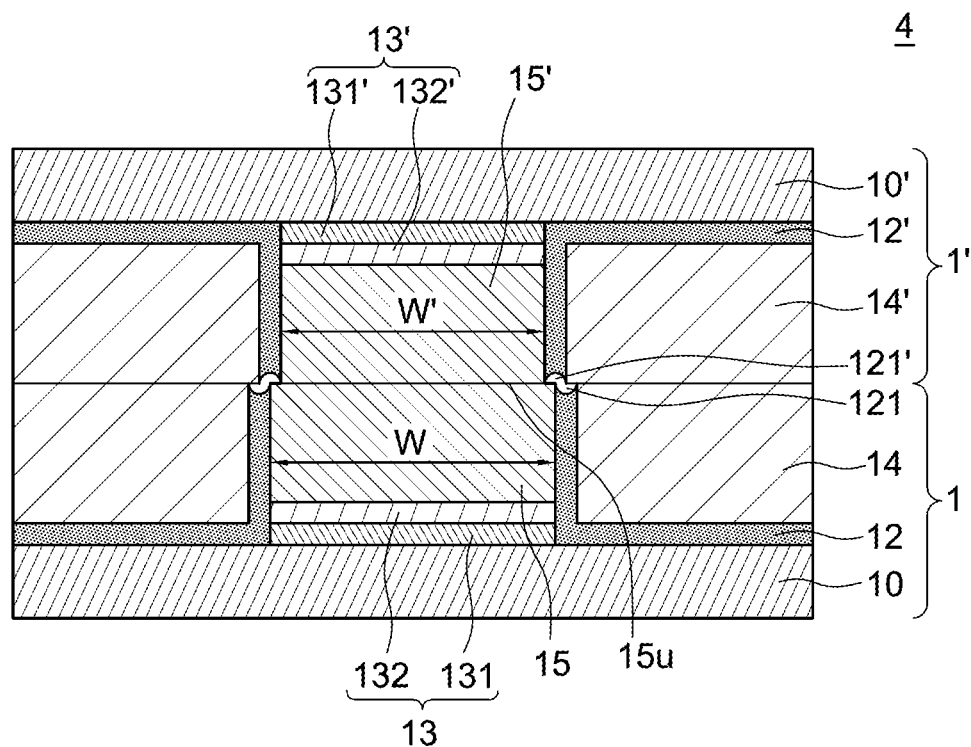

Referring to FIG. 6H, a bonding structure 1' may be similarly formed through the operations of FIGS. 6A to 6G. The bonding structure 1' includes a bonding pad. A size (e.g., the width W' and/or the footprint) of the bonding pad of the bonding structure 1' is smaller than a size (e.g., the width W and/or the footprint) of the bonding pad of the bonding structure 1. The bonding structure 1' is bonded to the bonding structure 1. Since the size of the bonding pad of the bonding structure 1' is smaller than the size of the bonding pad of the bonding structure 1, it is easy to align the bonding pad of the bonding structure 1' to the bonding pad of the bonding structure 1. At this time, spaces defined by the recesses of the bonding structures 1 and 1' are not filled by the dielectric layer 14 of the bonding structure 1 and a dielectric layer 14' of the bonding structure 1'.

During the bonding operation connecting the bonding structure 1' and the bonding structure 1, a bonding temperature reaches over a glass transition temperature point ($T_g$) of the dielectric layer 14 or 14'. The bonding temperature is greater than a temperature of the curing operation, which is lower than Tg. The bonding temperature may be ranged from about 220 degrees Celsius to about 250 degrees Celsius. Accordingly, the dielectric layer 14 of the bonding structure 1 and the dielectric layer 14' of the bonding structure 1' may be flowable at the bonding temperature and fill into the spaces defined by the recesses 121, 121' of the bonding structures 1 and 1' during the bonding operation. The dielectric layer 14 of the bonding structure 1 and the dielectric layer 14' of the bonding structure 1' may integrally form as one continuous dielectric material during the bonding operation. The semiconductor device package 4 as previously described in FIG. 4 is formed accordingly.

FIG. 7A through FIG. 7H illustrate some embodiments of a method of manufacturing a semiconductor device package 7 according to some embodiments of the present disclosure. Various figures have been simplified to more clearly present aspects of the present disclosure.

Figure 7A:
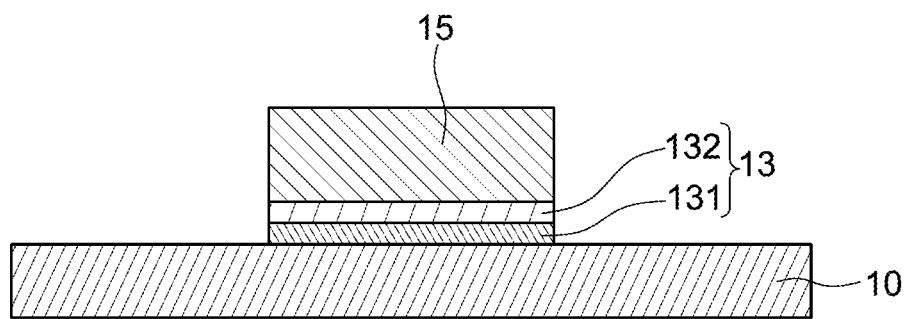
FIG. 7A to FIG. 7G illustrate intermediate operations of a method for manufacturing a semiconductor device package according to some embodiments of the present disclosure.

Referring to FIG. 7A, the method for manufacturing the semiconductor device package 7 (shown in FIG. 7G) includes providing a substrate 10 with a bonding pad. The bonding pad includes a seed layer 13 and a conductive pattern 15. The seed layer 13 includes a conductive layer 131 and a conductive layer 132. The conductive layer 131 and the conductive layer 132 are formed on the substrate 10 by physical vapor deposition operations, including, but not limited to, sputtering operations. The conductive layer 131 may include adhesion-enhancing materials such as Ti. The conductive layer 132 may include Cu. The conductive pattern 15 may include Cu. The formation of the conductive pad may follow the photolithography operations previously described in FIG. 6A to FIG. 6C.

Figure 7B:
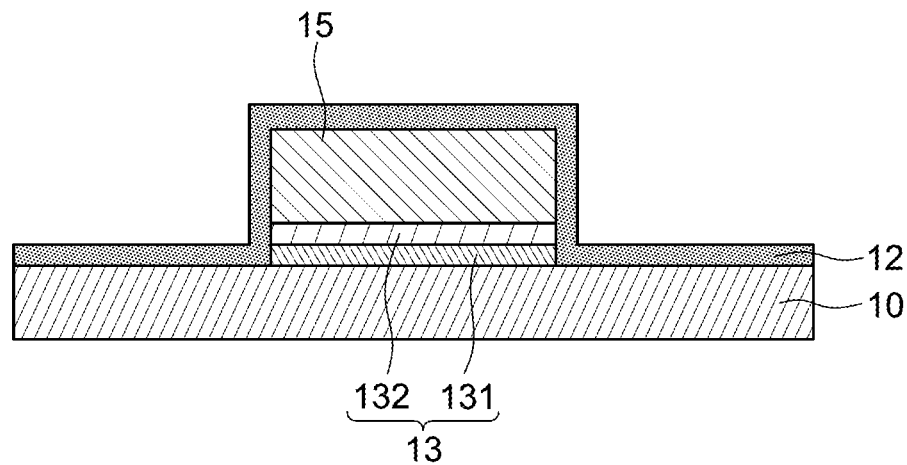

Referring to FIG. 7B, a dielectric layer 12 is conformably formed on the substrate 10 and the bonding pad by a CVD operation. The dielectric layer 12 includes silicon oxide and is conformably covering the lateral surfaces of the seed layer 13 and the conductive pattern 15, as well as a top surface of the conductive pattern 15. In some embodiments, the dielectric layer 12 has a thickness in a range from approximately 0.5 μm to approximately 4.5 μm. The dielectric layer 12 may be used as an etch stop in the subsequent operations.

Figure 7C:
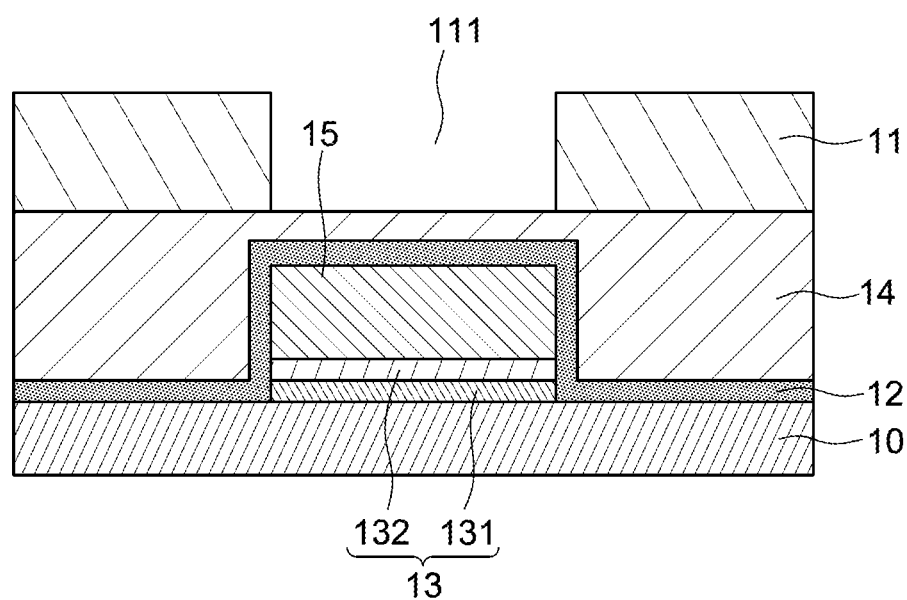

Referring to FIG. 7C, a dielectric layer 14 is formed over the dielectric layer 12 and the bonding pad by a spin coating operation. After the spin coating operation, the dielectric layer 14 is cured to volatilize solvent therein. The curing temperature is lower than a glass transition temperature ($T_g$) of the dielectric layer 14, for example, a glass transition temperature ($T_g$) is from about 180 degrees Celsius to about 220 degrees Celsius. An interface can be observed between the dielectric layer 12 and the dielectric layer 14. The dielectric layer 12 is having a greater density than the dielectric layer 14. A photoresist 11 is patterned with an opening 111 over the dielectric layer 14, defining an opening projecting over a portion of the conductive pad. A portion of the dielectric layer 14 is exposed by the opening 111.

Figure 7D:
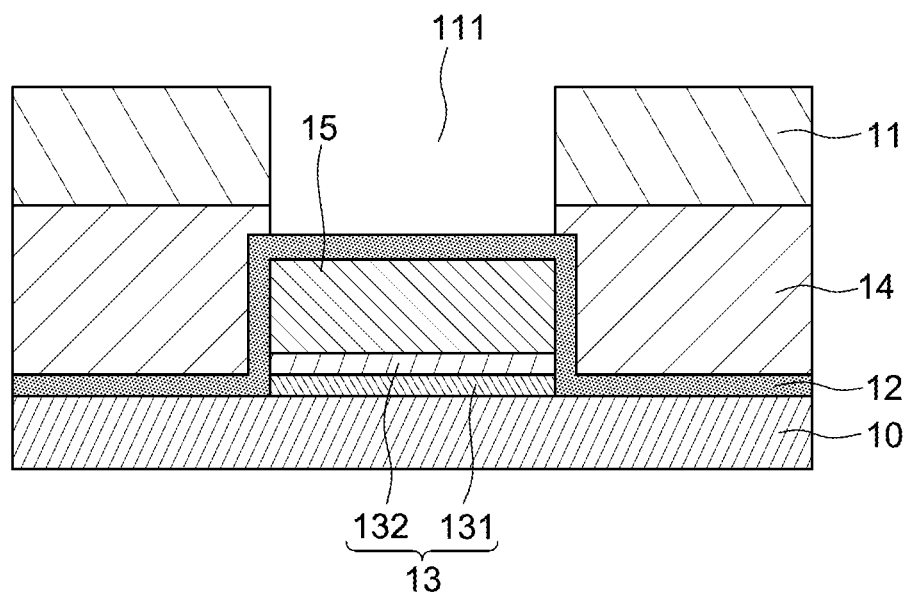

Referring to FIG. 7D, the exposed portion of the dielectric layer 14 is removed by a surface treatment, for example, a first dry etching operation.

Figure 7E:
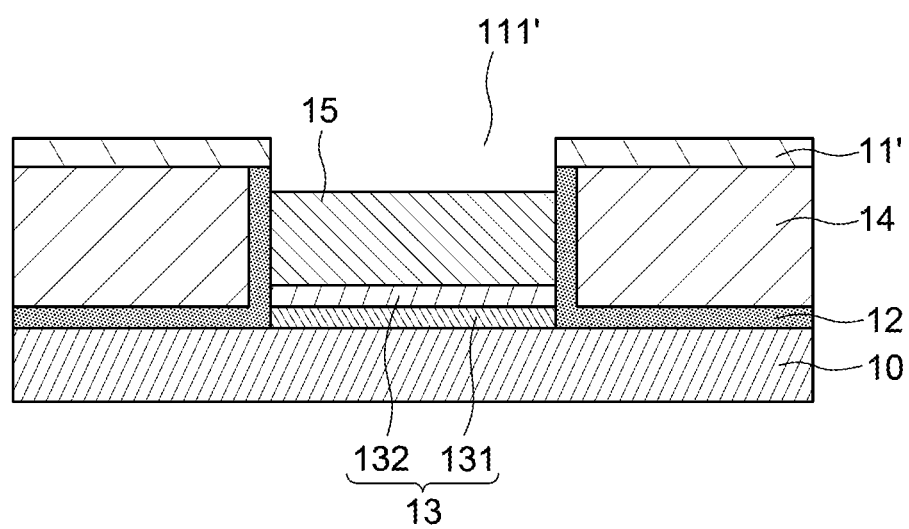

Referring to FIG. 7E, a surface treatment may be performed to remove the dielectric layer 12 by a second dry etching operation so as to expose the conductive pattern 15. Subsequently, a photoresist 11' is patterned with an opening 111' over the dielectric layer 12 and the dielectric layer 14 and to remove a portion of the conductive pattern 15 by a recess operation so that an upper portion of the sidewall of the dielectric layer 12 is exposed from the conductive pattern 15.

In some embodiments, the dielectric layer 14 and the dielectric layer 12 may be removed by mechanical operation(s) to expose the conductive pattern 15.

Figure 7F:
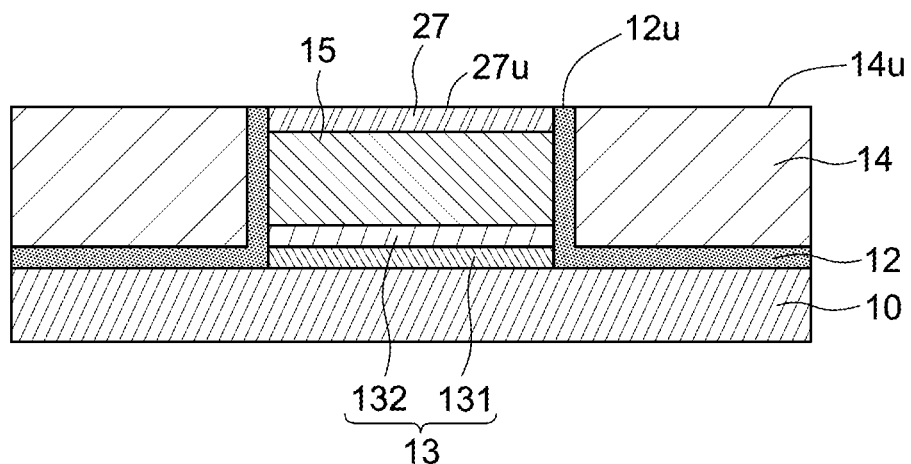

Referring to FIG. 7F, a conductive material is filled in the opening 111' to form a conductive pattern 27 and the photoresist 11' is subsequently removed. In some embodiments, the photoresist 11' may be removed and the conductive material is subsequently filled in the opening 111' to form the conductive pattern 27. A bonding structure 3 as previously described in FIG. 2 is formed accordingly. The conductive material of the conductive pattern 27 may include Au, Ag, or other suitable materials. An upper surface 27u of the conductive pattern 27, an upper surface 12u of the dielectric layer 12, and an upper surface 14u of the dielectric layer 14 are substantially coplanar with one another.

Figure 7G:
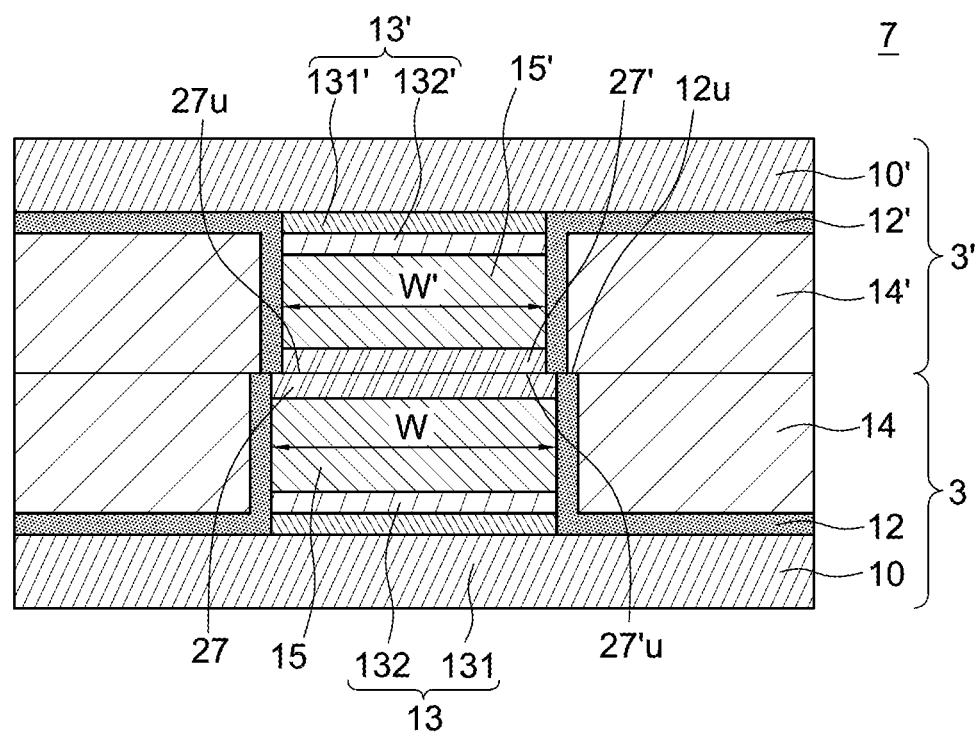

Referring to FIG. 7G, a bonding structure 3' may be similarly formed through the operations of FIGS. 7A to 7F. The bonding structure 3' includes a bonding pad. A size (e.g., the width W' and/or the footprint) of the bonding pad of the bonding structure 3' is smaller than a size (e.g., the width W and/or the footprint) of the bonding pad of the bonding structure 3. The bonding structure 3' is bonded to the bonding structure 3. Since the size of the bonding pad of the bonding structure 3' is smaller than the size of the bonding pad of the bonding structure 3, it is easy to align the bonding pad of the bonding structure 3' to the bonding pad of the bonding structure 3.

During the bonding operation connecting the bonding structure 3' and the bonding structure 3, a bonding temperature reaches over a glass transition temperature point ($T_g$) of the dielectric layer 14 or 14'. The bonding temperature is greater than a temperature of the curing operation, which is lower than $T_g$. The bonding temperature may be ranged from about 220 degrees Celsius to about 250 degrees Celsius. Accordingly, the dielectric layer 14 of the bonding structure 1 and the dielectric layer 14' of the bonding structure 3' may be flowable at the bonding temperature and fill into the spaces defined by the recesses 121, 121' of the bonding structures 3 and 3' during the bonding operation. The dielectric layer 14 of the bonding structure 3 and the dielectric layer 14' of the bonding structure 3' may integrally form as one continuous dielectric material during the bonding operation. The semiconductor device package 7 is formed accordingly.

As used herein, spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A method for manufacturing a bonding structure, comprising:
    providing a substrate with a seed layer;
    forming a conductive pattern on the seed layer;
    forming a dielectric layer on the substrate and the conductive pattern; and
    removing a portion of the dielectric layer to expose an upper surface of the conductive pattern without consuming the seed layer,
    wherein forming the dielectric layer further comprises:
       forming a first dielectric layer conformably to the substrate and the conductive pattern; and
       forming a second dielectric layer on the first dielectric layer, and
    wherein forming the first dielectric layer comprises performing a chemical vapor deposition operation and forming the second dielectric layer comprises performing a spin coating operation.

2. The method of claim 1, wherein the first dielectric layer comprises silicon oxide, and the second dielectric layer comprises spin-coating dielectric.

3. The method of claim 1, wherein an interface is between the first dielectric layer and the second dielectric layer.

4. The method of claim 1, wherein removing the portion of the dielectric layer further comprises performing a surface treatment to expose the upper surface of the conductive pattern.

5. The method of claim 4, wherein performing the surface treatment to expose the upper surface of the conductive pattern forms a recess in the first dielectric layer.

6. The method of claim 4, wherein performing the surface treatment comprises utilizing an etching chemistry more selective to the first dielectric layer than to the second dielectric layer.

7. The method of claim 4, further comprising a curing operation for baking the dielectric layer before performing the surface treatment.

8. The method of claim 7, further comprising a bonding operation after performing the surface treatment, wherein a bonding temperature of the bonding operation is greater than a curing temperature of the curing operation.

9. The method of claim 8, wherein performing the surface treatment to expose the upper surface of the conductive pattern forms a recess in the first dielectric layer, and the recess is filled during the bonding operation.

10. The method of claim 7, wherein a curing temperature is lower than a glass transition temperature of the second dielectric layer.

11. The method of claim 4, wherein performing the surface treatment to expose an upper surface of the conductive pattern forms a concave surface at the first dielectric layer.

12. The method of claim 4, wherein the upper surface of the conductive pattern and an upper surface of the second dielectric layer are substantially coplanar.

13. The method of claim 1, further comprising forming a second conductive pattern on the conductive pattern prior to performing a surface treatment.

14. A method for manufacturing a semiconductor device package, comprising:
    providing a substrate with a seed layer;
    forming a first conductive pattern on the seed layer;

forming a first dielectric layer conformably to the substrate and the first conductive pattern;

forming a second dielectric layer on the first dielectric layer;

removing a portion of the dielectric layer to expose an upper surface of the first conductive pattern without consuming the seed layer to form a first bonding structure; and connecting a second bonding structure to the first bonding structure during a bonding operation, wherein forming the first dielectric layer comprises performing a chemical vapor deposition operation and forming the second dielectric layer comprises performing a spin coating operation.

15. The method of claim 14, wherein the first bonding structure includes a first recess and the second bonding structure includes a second recess, and wherein the second recess partially overlaps the first recess from a cross sectional perspective.

16. The method of claim 14, wherein the second bonding structure includes a second conductive pattern, and the second conductive pattern is in contact with the first conductive pattern.

17. The method of claim 16, wherein a size of the second conductive pattern is less than a size of the first conductive pattern.

* * * * *